United States Patent
Pollock et al.

(10) Patent No.: US 6,479,886 B1
(45) Date of Patent: *Nov. 12, 2002

(54) INTEGRATED CIRCUIT PACKAGE WITH EMI SHIELD

(75) Inventors: Steven L. Pollock, Hillsboro, OR (US); Robert L. Olivier, Forest Grove, OR (US)

(73) Assignee: Intel Corporation, Santa Clara, CA (US)

(*) Notice: Subject to any disclaimer, the term of this patent is extended or adjusted under 35 U.S.C. 154(b) by 8 days.

This patent is subject to a terminal disclaimer.

(21) Appl. No.: 09/662,056

(22) Filed: Sep. 15, 2000

Related U.S. Application Data

(63) Continuation-in-part of application No. 09/596,945, filed on Jun. 19, 2000, now Pat. No. 6,365,960.

(51) Int. Cl.[7] .............................................. H01L 23/552
(52) U.S. Cl. ...................... 257/659; 257/660; 257/787; 438/112; 438/124; 438/127
(58) Field of Search .................................. 257/659, 660, 257/787; 438/112, 124, 127; 361/816, 818; 174/35 R, 35 GC

(56) References Cited

U.S. PATENT DOCUMENTS

| | | | |
|---|---|---|---|
| 3,735,209 A | 5/1973 | Saddler | 317/234 R |
| 5,561,265 A | 10/1996 | Livshits et al. | 174/35 |
| 5,650,659 A * | 7/1997 | Mostafazadeh et al. | 257/660 |
| 6,020,939 A * | 2/2000 | Rindal et al. | 348/805 |
| 6,350,951 B1 * | 2/2002 | Askew | 174/52.2 |
| 6,365,960 B1 * | 4/2002 | Pollock et al. | 257/659 |

FOREIGN PATENT DOCUMENTS

| | | | | |
|---|---|---|---|---|
| JP | 4-147652 A | * | 5/1992 | |
| JP | 404147652 A | | 5/1992 | ........... H01L/23/00 |
| JP | 5-55448 A | * | 3/1993 | |

* cited by examiner

*Primary Examiner*—Steven Loke
*Assistant Examiner*—Donghee Kang
(74) *Attorney, Agent, or Firm*—Mark V. Seeley

(57) ABSTRACT

An improved packaged IC is disclosed, which includes a semiconductor die mounted to a substrate and an EMI shield that encapsulates the semiconductor die. In addition, a ground pin is electrically coupled to the semiconductor die, a ferrite bead is electrically coupled to the EMI shield and the ground pin, and a package body encapsulates the EMI shield.

11 Claims, 2 Drawing Sheets

US 6,479,886 B1

INTEGRATED CIRCUIT PACKAGE WITH EMI SHIELD

This is a continuation-in-part application of U.S. application Ser. No. 09/596,945, filed Jun. 19, 2000, now U.S. Pat. No. 6,365,960.

FIELD OF THE INVENTION

The present invention relates to integrated circuit packages, in particular, those containing die that generate substantial levels of electromagnetic emissions.

BACKGROUND OF THE INVENTION

Computer systems can emit electromagnetic radiation at various frequencies. Those emissions may cause undesirable electromagnetic interference ("EMI") with the circuitry of the computer system and other electronic equipment near the computer system. For that reason, the FCC has enacted certain Open Chassis EMI regulations that impose limits on the electromagnetic emissions that such systems generate. 47 CFR §15.109. These limits are specified in Table 1 below.

TABLE 1

Field Strength Limits for Unintentional Radiators at a Distance of 3 Meters

| Frequency of Emission (MHz) | Field Strength (microvolts/meter) |
|---|---|
| 30–88 | 100 |
| 88–216 | 150 |
| 216–960 | 200 |
| >960 | 500 |

Currently, most of the EMI that computer motherboards cause results from emissions produced by the packaged integrated circuits ("ICs") that are mounted, or coupled, to the motherboard. To block (or reduce) the emissions that those parts release, various types of Faraday cages (or other sealing/covering apparatus) may be placed over them. Such devices, however, add cost to the system, may occupy scarce motherboard space, and may impose challenging signal routing requirements. As a consequence, using such devices to reduce the EMI that these packaged ICs cause is not a particularly attractive solution.

Accordingly, there is a need for an improved mechanism for reducing IC generated EMI. There is a need for such a mechanism that can be integrated into standard component designs without requiring significant modification. The packaged IC of the present invention includes such a mechanism.

DETAILED DESCRIPTION OF THE PRESENT INVENTION

A packaged integrated circuit ("IC") is described. That device includes a substrate upon which is mounted a semiconductor die. An EMI shield encapsulates the semiconductor die, and a package body encapsulates the EMI shield. The packaged IC of the present invention further includes a ground pin that is electrically coupled to the semiconductor die, and a ferrite bead that is electrically coupled to both the EMI shield and the ground pin. In the following description, numerous details are set forth to provide a thorough understanding of the present invention. However, it will be apparent to those skilled in the art that the invention may be practiced in many ways other than those expressly described here. The invention is thus not limited by the specific details disclosed below.

Figure 1:
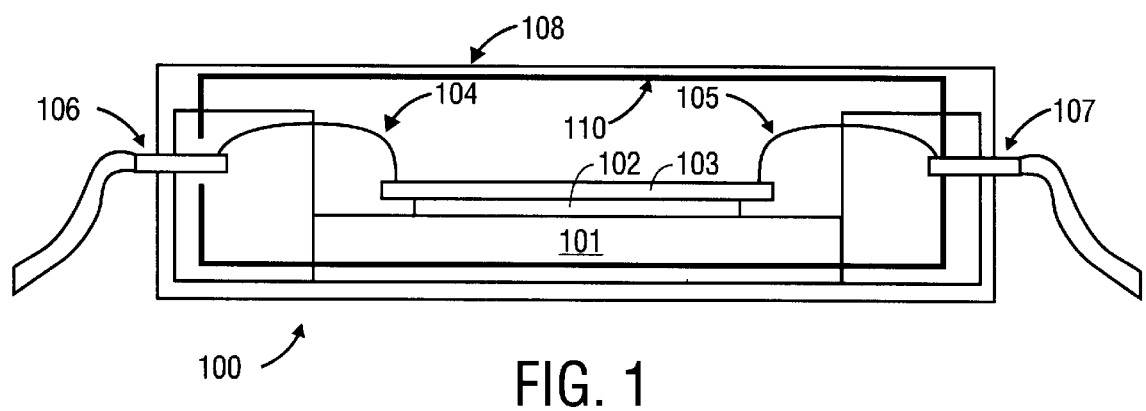
FIG. 1 illustrates a side view of a cross-section of an embodiment of the packaged integrated circuit of the present invention.

FIG. 1 illustrates a packaged IC according to one embodiment of the present invention. IC 100 comprises elements found in conventional devices, such as package tub 101, pedestal 102, semiconductor die 103, bond wires 104 and 105, external pins 106 and 107, and package body 108. Those elements may be made from materials conventionally used to make packaged ICs, using conventional processes. (In this embodiment, package tub 101 and pedestal 102 comprise the IC substrate upon which die 103 is mounted.) In addition to such standard components, IC 100 includes EMI shield 110. EMI shield 110 encapsulates semiconductor die 103, and is itself encapsulated by package body 108.

By grounding EMI shield 110 to the motherboard, e.g., via connection to one of IC 100's ground pins, EMI shield 110 may form a grounded Faraday cage that is integrated within the IC package. To serve as an EMI barrier, EMI shield 110 should be formed from aluminum or another conductive material that can block electromagnetic radiation. In a preferred embodiment of the present invention, such a conductive shield, or cage, surrounds die 103 and is connected exclusively to one or more of the package's ground pins.

The packaged IC of the present invention enables EMI to be contained and suppressed at the package level. As a result, additional costly, cumbersome and motherboard space occupying covers or shields need not be placed over the IC to minimize EMI. In addition, incorporating an EMI shield into the IC package (and thereby suppressing EMI closer to its source) may enable signal integrity related problems to be reduced by decreasing emissions of electromagnetic energy that could otherwise affect nearby traces and circuitry. Although particularly applicable to ICs that cause substantial EMI, EMI shield 110 may be integrated into all kinds of packaged ICs to reduce their contribution to EMI.

Figure 2:
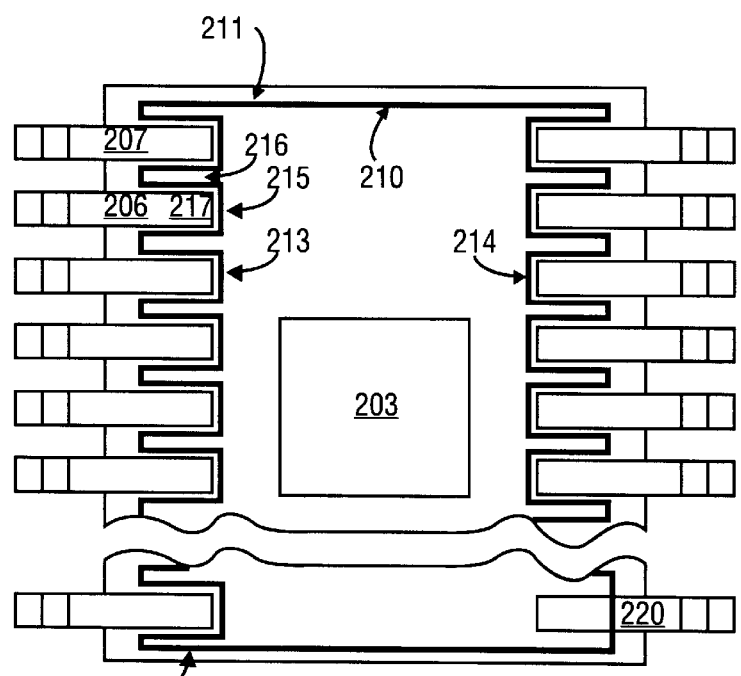
FIG. 2 illustrates an overhead view of a cross-section of the embodiment of the present invention that is shown in FIG. 1.

FIG. 2 provides an overhead view of a cross-section of an embodiment of the packaged integrated circuit of the present invention. In this embodiment, EMI shield 210 includes first, second, third, and fourth side surfaces—211, 212, 213, and 214, respectively. EMI shield 210 also preferably includes substantially planar upper and lower surfaces (not shown). Side surfaces 211, 212, 213, and 214 are each preferably oriented substantially perpendicular to those upper and lower surfaces. As shown in FIG. 2, first side surface 211 and second side surface 212 are each substantially planar and are oriented substantially perpendicular to third and fourth side surfaces 213 and 214.

In this embodiment, third and fourth side surfaces 213 and 214 each have a substantially jigsaw like configuration, in which indented portions 215 alternate with extended portions 216. Indented portions 215 engage extended portions 216 at substantially 90° angles. Side surfaces 213 and 214 receive a plurality of external pins, e.g., pis 206 and 207. Indented portions 215 each receive an end 217 of an external pin 206. Extended portions of side surfaces 213 and 214 (for example, extended portion 216) penetrate between adjacent external pins, e.g., pins 206 and 207, a distance along the length of those pins.

As shown in FIG. 2, EMI shield 210 forms a grounded Faraday cage that surrounds semiconductor die 203 on all of die 203's surfaces. In this embodiment, EMI shield 210 is connected to ground pin 220. Although in this example shield 210 is connected to only a single ground pin, large/complex ICs may require shield 210 to be connected to a larger number of ground pins.

Figure 3:
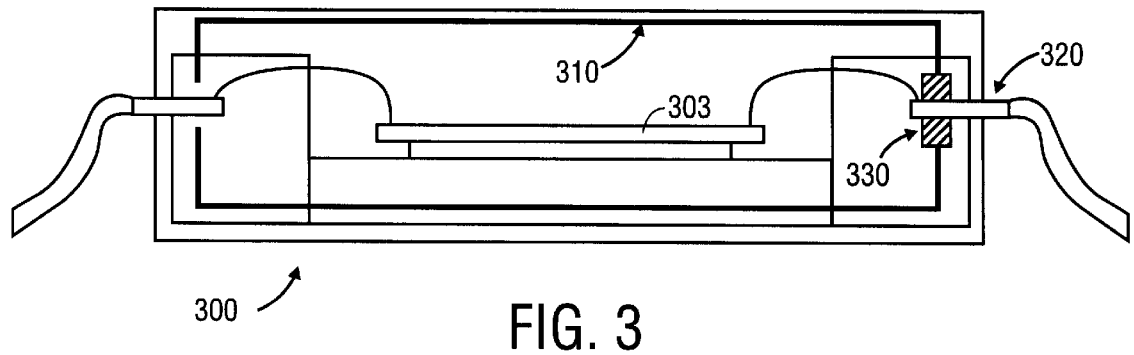
FIG. 3 illustrates a side view of a cross-section of a second embodiment of the packaged integrated circuit of the present invention.
Figure 4:
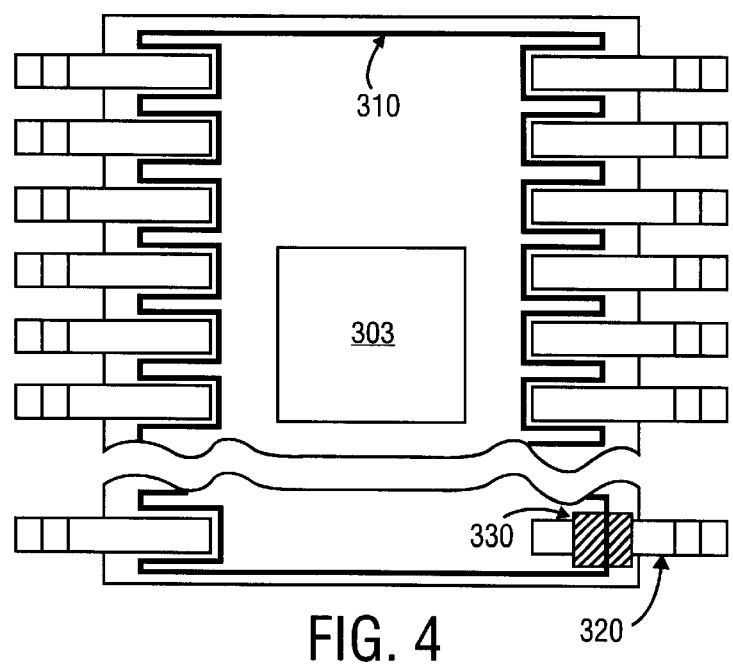
FIG. 4 illustrates an overhead view of a cross-section of the embodiment of the present invention that is shown in FIG. 3.

FIGS. 3 and 4 illustrate a second embodiment of the packaged integrated circuit of the present invention. The difference between IC 100, of FIGS. 1 and 2, and IC 300, of FIGS. 3 and 4, is the addition of ferrite bead 330, which is electrically coupled to EMI shield 310 and ground pin 320. With the exception of ferrite bead 330, all components of IC 330 are identical to those of IC 100, such that a detailed discussion of the remaining components is deemed duplicative and therefore unnecessary.

Ferrite bead 330 serves to block high-frequency current from EMI shield 310 to ground pin 320, which reduces the likelihood that unwanted electromagnetic radiation will be transmitted from pin 320 to die 303. Ferrite bead 330 provides this benefit by forming a high impedance connection between EMI shield 310 and ground pin 320 at that shield's resonant frequencies. Attenuating the high-frequency current in this fashion effectively minimizes the amplitude of the current flowing through ground pin 320, and thus minimizes the degree to which EMI may affect die 303.

Although ferrite bead 330 has high impedance at the resonant frequency of EMI shield 310, it has low impedance at frequencies that are much lower than the resonant frequency. That property ensures that placing ferrite bead 330 between shield 310 and pin 320 will not degrade current flow from shield 310 to ground, while further ensuring that bead 330 will provide an effective EMI barrier. Although, like FIGS. 1 and 2, shield 310 is shown here connected to only a single ground pin, large/complex ICs may require shield 310 to be connected to a larger number of ground pins—each being electrically coupled to one or more ferrite beads, which are placed between the EMI shield and the ground pin.

An improved packaged IC has been described. That IC includes an EMI shield that has been integrated into it for blocking electromagnetic emissions that the IC may generate. Integrating such an EMI shield inside an IC package may be particularly useful for ICs that produce substantial EMI. By forming an EMI shield inside an IC package, the resulting IC will generate less electromagnetic emissions without requiring placement of costly and cumbersome shielding/covering mechanisms over the device.

Additional components that may be included in the illustrated packaged IC have been omitted as they are not useful to describe aspects of the present invention. Although the foregoing description has specified a packaged IC that includes certain features, those skilled in the art will appreciate that many modifications and substitutions may be made. For example, although the embodiment described above relates to an IC package having bond pads formed on the die opposite the package's mounting surface, the present invention may be used in other types of IC packages, such as flip chip, chip-on-flex, etc. . . . Also, although described in the context of a packaged IC for a computer motherboard, the present invention may apply to ICs used in various other applications, e.g., cellular phones, information appliances, personal digital assistants, set top boxes, telecommunication equipment, power supplies, consumer electronics, etc. . . . In addition, the shape of the EMI shield that is incorporated into the packaged IC is not important as long as it serves its EMI reducing function. Accordingly, it is intended that all such modifications, alterations, substitutions and additions be considered to fall within the spirit and scope of the invention as defined by the appended claims.

What is claimed is:

1. A packaged integrated circuit comprising:
    a substrate;
    a semiconductor die mounted to the substrate;
    an EMI shield that encapsulates the semiconductor die;
    a ground pin electrically coupled to the semiconductor die;
    a ferrite bead electrically coupled to the EMI shield and the ground pin; and
    a package body that encapsulates the EMI shield;
    wherein the EMI shield has substantially planar upper and lower surfaces and first, second, third and fourth side surfaces, those side surfaces each oriented substantially perpendicular to both the upper and lower surfaces, the first and second side surfaces each being substantially planar and oriented substantially perpendicular to the third and fourth side surfaces, the third and fourth side surfaces receiving a plurality of external pins; and
    wherein the third and fourth side surfaces each have a substantially jigsaw like configuration, in which indented portions alternate with extended portions, the indented portions each receiving an end of each of the plurality of external pins, and the extended portions penetrating between adjacent external pins a distance along the length of those pins.

2. The packaged integrated circuit of claim 1 wherein the EMI shield comprises aluminum.

3. The packaged integrated circuit of claim 2 wherein the EMI shield forms a rounded Faraday cage that surrounds the semiconductor die on all of the die's surfaces.

4. The packaged integrated circuit of claim 3 wherein the package body encapsulates the ferrite bead.

5. A packaged integrated circuit comprising:
    a substrate;
    a semiconductor die mounted to the substrate;
    an EMI shield that encapsulates the semiconductor die, the EMI shield including a side surface having indented and extended portions;
    a plurality of external pins, each pin having an end that fits between a pair of the extended portions and within an indented portion;
    a ground pin electrically coupled to the semiconductor die;
    a ferrite bead electrically coupled to the EMI shield and the ground pin; and
    a package body that encapsulates the EMI shield.

6. The packaged integrated circuit of claim 5 wherein the side surface has a substantially jigsaw like configuration, in which the indented portions alternate with the extended portions, the extended portions penetrating between adjacent external pins a distance along the length of those pins.

7. The packaged integrated circuit of claim 6 wherein the EMI shield comprises aluminum, and forms a grounded Faraday cage that surrounds the semiconductor die on all of the die's surfaces.

8. The packaged integrated circuit of claim 7 wherein the package body encapsulates the ferrite bead.

9. A computer assembly comprising a packaged integrated circuit which comprises:
- a substrate;
- a semiconductor die mounted to the substrate;
- an EMI shield that encapsulates the semiconductor die;
- a ground pin electrically coupled to the semiconductor die;
- a ferrite bead electrically coupled to the EMI shield and the ground pin; and
- a package body that encapsulates the EMI shield;
- wherein the EMI shield includes a side surface that receives a plurality of external pins; and
- wherein the side surface has a substantially jigsaw like configuration, in which indented portions alternate with extended portions, the indented portions each receiving an end of each of the plurality of external pins, and the extended portions penetrating between adjacent external pins a distance along the length of those pins.

10. The computer assembly of claim 9 wherein the EMI shield forms a grounded Faraday cage that surrounds the semiconductor die on all of the die's surfaces.

11. The computer assembly of claim 10 wherein the package body encapsulates the ferrite bead.

* * * * *

UNITED STATES PATENT AND TRADEMARK OFFICE
CERTIFICATE OF CORRECTION

PATENT NO.    : 6,479,886 B1
DATED         : November 12, 2002
INVENTOR(S)   : Pollock et al.

It is certified that error appears in the above-identified patent and that said Letters Patent is hereby corrected as shown below:

Column 2,
Line 66, delete "pis", insert -- pins --.

Signed and Sealed this

Twenty-fifth Day of February, 2003

JAMES E. ROGAN
*Director of the United States Patent and Trademark Office*